United States Patent [19]

Patel

[11] 4,167,031
[45] Sep. 4, 1979

[54] HEAT DISSIPATING ASSEMBLY FOR SEMICONDUCTOR DEVICES

[75] Inventor: Parbhubhai D. Patel, Andover, Mass.

[73] Assignee: Bell Telephone Laboratories, Incorporated, Murray Hill, N.J.

[21] Appl. No.: 917,459

[22] Filed: Jun. 21, 1978

[51] Int. Cl.² ............................................. H05K 7/20
[52] U.S. Cl. ................................... 361/388; 361/386; 174/16 HS; 357/79
[58] Field of Search ............... 357/79, 81; 174/16 HS; 361/386–389

[56] References Cited

U.S. PATENT DOCUMENTS

| | | | |
|---|---|---|---|
| 3,146,384 | 8/1964 | Ruehle | 357/81 |
| 3,327,180 | 6/1967 | Winter | 357/81 |
| 3,340,345 | 9/1967 | Campbell | 174/15 |
| 3,495,131 | 2/1970 | Melcher | 174/16 HS |
| 3,522,491 | 8/1970 | Coe | 357/81 |
| 3,649,738 | 3/1972 | Andersson | 174/15 |
| 3,911,327 | 10/1975 | Murari | 174/16 HS |
| 3,916,435 | 10/1975 | Camplin | 357/79 |
| 3,946,276 | 3/1976 | Braun | 357/79 |

OTHER PUBLICATIONS

Wrap-Around Heat Sink, Bond, IBM Tech. Discl. Bulletin, vol. 20, No. 4, Sep. 1977, p. 1434.

Primary Examiner—Gerald P. Tolin
Attorney, Agent, or Firm—H. W. Lockhart

[57] ABSTRACT

A heat conducting and radiating arrangement for an electronic assembly, which includes heat generating semiconductor devices, comprises a thermally conductive holder member 20 for the semiconductor device 13 which is conveniently clamped to a large area, heat radiating member 12. The holder member 20 is adapted to be mounted, secure from rotation, to a circuit board 11 to which the semiconductor device 13 is electrically connected.

4 Claims, 1 Drawing Figure

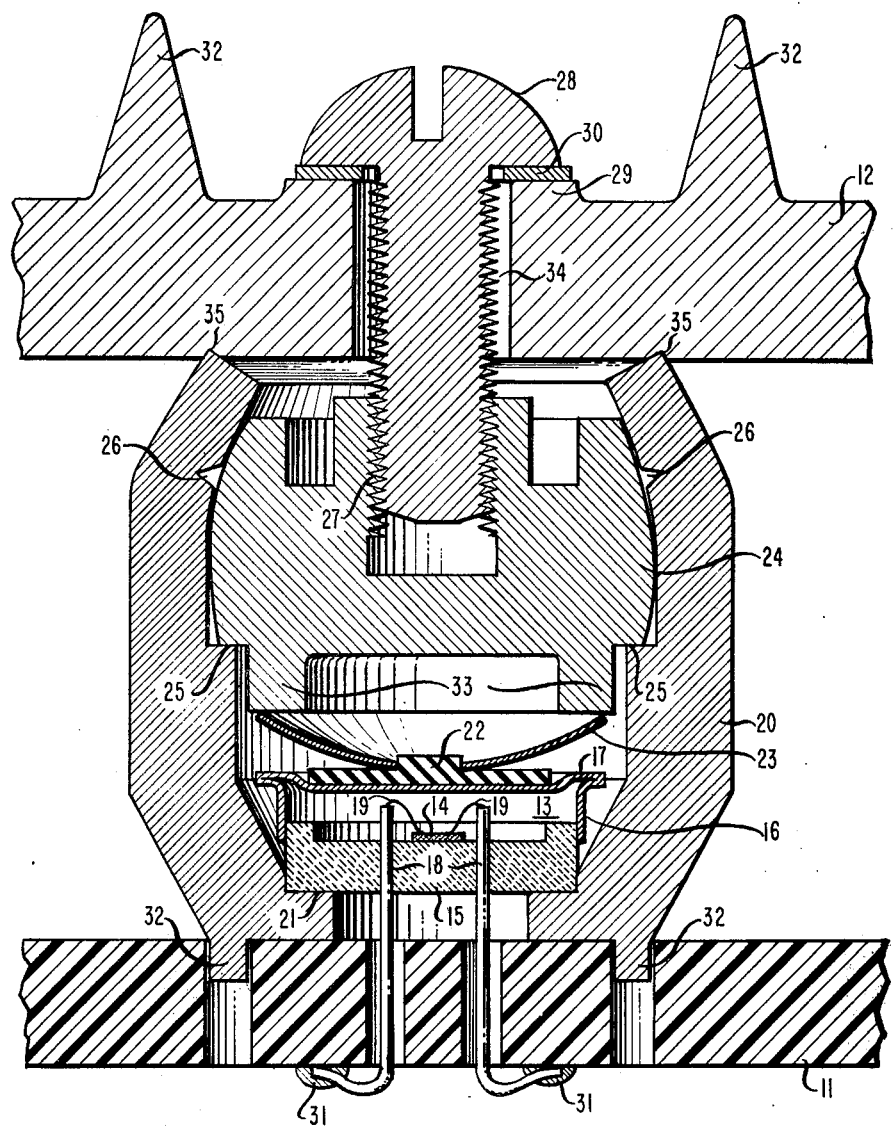

HEAT DISSIPATING ASSEMBLY FOR SEMICONDUCTOR DEVICES

BACKGROUND OF THE INVENTION

This invention relates to means for extracting and radiating heat from heat generating semiconductor devices, particularly as they are installed in arrays in electronic assemblies.

The use of auxiliary holders and encapsulations for extracting and radiating heat from semiconductor devices is a well known practice. However, in particular, for electronic assemblies in which a wide variety of electronic components and connective elements are installed on a circuit board with semiconductor devices which generate appreciable heat during operation, means must be provided for directing that heat away from the circuit board and components thereon. In particular, it is necessary to provide thermal conducting paths from the usual plurality of semiconductor devices in a circuit, to a common heat radiating member to avoid raising the ambient temperature of the electronic circuit to levels which damage the circuit. Moreover, it is desirable that the heat radiating member be readily assembled and disassembled to the electronic assembly and that design changes which add or remove semiconductor devices and accompanying thermal conducting means be done with ease and facility. Withal, the means providing the thermal path from the semiconductor device to the heat radiating member should be closely coupled thermally both to the semiconductor device and to the heat radiating member.

SUMMARY OF THE INVENTION

The foregoing stated need is met in accordance with this invention by means within an electronic assembly which comprises a circuit board member having terminals and an interconnecting circuit thereon, a heat radiating member mounted in substantially parallel, spaced-apart relation to the circuit board member, and a heat generating, encapsulated semiconductor device electrically connected to terminals on the circuit board. Included within this assembly is low thermal impedance means for holding the semiconductor device in electrically insulating, thermally conductive relation, comprising a cup-like, thermally conductive holder member having an internal shelf surface for engaging at least a portion of the surface of the semiconductor device encapsulation from which heat is dissipated. The holder member includes pin means which engage the circuit board for preventing rotation, and retaining means within the holder member for electrically insulatively retaining the semiconductor device in engagement with the holder member, and screw means for drawing the holder member into thermal contact with the heat radiating member. The assembly further includes means for enhancing the heat radiation from the heat radiating member comprising surface-increasing members such as fins on the surface opposite the surface to which the holder member is attached.

The embodiment in accordance with this invention thus comprises a holder member which consists of a minimum number of parts and is designed to be easily assembled so that the contact pressure between the semiconductor device and the holder is substantially the same from one assembly to another, despite slight dimensional differences, and the array of electrically connected semiconductor devices as installed in holder members is facilely assembled to the heat radiating member using simple screw or stud means to insure good thermal contact.

BRIEF DESCRIPTION OF THE DRAWING

The invention and its other aspects and features will be more readily understood from the following detailed description taken in conjunction with the drawing which shows in cross section the portion of an electronic assembly in accordance with this invention comprising the semiconductor device and the segment of the circuit board to which it is electrically connected, the holder member comprising the thermal path and the portion of the heat radiating member to which the thermally conductive holder member is attached.

DETAILED DESCRIPTION

Referring to the drawing, the basic part of the electronic assembly is the circuit board 11 which may be of the conventional printed circuit board configuration. Spaced apart from the circuit board in substantially parallel relation is a metal heat radiating member 12. Between the circuit board member 11 and the heat radiating member 12, there is mounted the encapsulated semiconductor device 13. In a typical installation, the encapsulated device 13 comprises a semiconductor transistor chip 14, usually having three electrodes, two of which are illustrated as wire connectors 19 interconnecting electrodes on the chip 14 and wire terminal leads 18. As shown in the drawing, the leads 18 pass through the circuit board and are shaped and externally connected, typically by soldering to terminals 31 constituted by printed pads on the lower face of the circuit board 11.

Although not shown, it will be understood that the lower face of the circuit board 11 includes a plurality of circuit components such as capacitors, resistors, and inductors, and an interconnection pattern. In addition, particularly for higher frequency applications, the assembly may include coaxial cables and connectors and terminations. Moreover, it will be understood that although one semiconductor device, in this case a transistor is shown, it is usual to include a plurality of such devices which may also include diodes which likewise produce heat which requires removal.

The encapsulated semiconductor device 13 comprises a housing illustrated in relatively simple configuration. The semiconductor chip 14 is mounted on a header 15 typically fabricated of a ceramic which is an electrical insulator but a thermal conductor. In addition to the commonly used ceramic, aluminum oxide, use may also be made of materials such as beryllium oxide for the header 15. The encapsulation is completed by the metal ring 16 bonded to a portion of the ceramic header 15 and the metal cover 17, which is in turn bonded at the peripheral flange as illustrated. It will be understood that this encapsulated semiconductor device is exemplary and that other configurations may be used, which however, all share the common characteristic of providing an electrically insulating thermally conductive portion between the heat generating semiconductor chip and the heat conducting holder member.

The semiconductor device 13 is mounted within the metal holder member 20 so that the ceramic header 15 rests in part upon the lower shelf 21 in the lower portion of the holder. The inner wall of the holder member 20 is shaped so that the thermally conductive, electrically insulating header rests snugly within the holder to prevent metal portions of the encapsulation from touching metal parts of the holder member. In particular, the semi-conductor encapsulation device 13 is retained electrically insulatively within the holder member by the combination of the electrically insulating washer 22, the metal spring member 23 and the metal ferrule 24. The ferrule 24 rests on the upper shelf 25 within the holder member 20 and has a ring portion 33 which contacts the spring member 23, which in turn, in combination with the washer 22, spring biases the device encapsulation downward against the lower shelf 21 of the holder. The ferrule 24 is assembled in the holder member 20 as a press fit and is "rolled on" by deflection of the uppermost portions of the walls of the holder member during the assembly operation. The slit 26 facilitates the deflection of the uppermost wall portion. To facilitate good thermal contact between the parts of this assembly, it is advantageous to coat the interior of the holder member with a thin film of a relatively soft, thermally conductive material, such as indium. As a consequence of this arrangement of ferrule, spring, washer and device within the holder member, small manufacturing variations in dimensions are accommodated while still insuring good contact pressure between the transistor header 15 and the holder member 20.

Typically, with an array of semiconductor devices attached to the circuit board, each in a holder member as shown, the heat radiating member 12 is readily assembled in good thermal contact with the holder members. This is accomplished by the provision of holes 34 at appropriate locations in the heat radiating member 12 through which screw means 28 are inserted to engage the tapped recess 27 centrally located in the ferrule member 24. It is convenient to provide a land portion 29 on the member 12 and a metal washer 30 to insure easy application of pressure as the screw means are applied. Alternatively, the extruded or otherwise formed surface may be machined to produce a suitable flat thereon. Typically, the holder member 20 may be of an easy machining, thermally conductive material such as copper with a small amount of tellurium. The ferrule 24 may be of brass and heat radiating member 12 advantageously is aluminum. The insulating washer 22 is phenolic and the spring 23 is spring steel. The tapped recess 27 should be blind and provide ample depth to insure good contact at the peripheral portion 35 where the holder member contacts the heat radiating member 12. Radiation from the heat radiating member 12 is enhanced by surface increasing members such as the fins 32 on the upper face.

Rotation of the holder member assembly during attachment to the heat radiating member 12 is prevented by the pins 32 oppositely located on the holder 20, which engage recesses in the circuit board. It will be appreciated that in lieu of a tapped recess in the ferrule and screw means, this attachment may likewise be made by providing a threaded stud and nut combination. However, the arrangement described and illustrated has been found advantageous from the standpoint of ease of fabrication and assembly. Assembly and disassembly of the heat radiating member is a simple matter of removal of the several screw means which attach the member 12 to the plurality of thermal conducting assemblies. Obviously, in certain assemblies, additional structural elements such as support columns, or stand-offs not shown, may be installed to stabilize the assembly.

I claim:

1. An electronic assembly comprising
   (A) a circuit board member (11) having terminals (31) and an interconnecting circuit thereon,
   (B) a heat-radiating member (12) mounted in substantially parallel, spaced-apart relation to said circuit board member (11),
   (C) a heat-generating, encapsulated semiconductor device 13 electrically connected to terminals (31) on said circuit board, CHARACTERIZED IN THAT said assembly includes,
   (1) low thermal impedance means for holding said semiconductor device in electrically insulating, thermally conductive relation in said assembly, said means comprising
      (a) a cup-like thermally conductive holder member (20) having an internal first shelf surface (21) engaging at least a portion of the surface of the encapsulated semiconductor device (13) from which heat is dissipated, said member including pin means (32) engaging said circuit board (11) for preventing rotation therebetween, retaining means at least partially of insulating material (24), (23), (22) within said holder member (20) electrically insulatively retaining the semiconductor device (13) in engagement with said holder member (20), screw means (28) for drawing said holder member (20) into thermal contact with said heat radiating member (12), and
      (b) means for enhancing the heat radiation from said heat radiating member (12) comprising surface-increasing members (32) on the surface of member (12) opposite from said holder member (20).

2. An electronic assembly in accordance with claim 1 characterized further in that a washer member (22) contacts the semiconductor device, a spring member (23) contacts said washer member and a ferrule member (24) rests on a second shelf surface (25) in said holder member (20) and contacts said spring member (23).

3. An electronic assembly in accordance with claim 1 characterized further in that said screw means comprise a threaded recess (27) in said ferrule member (24) in combination with a screw member (28).

4. An electronic assembly in accordance with claim 1 characterized further in that said surface increasing members (32) are fins.

* * * * *